(12) United States Patent
Gundlach

(10) Patent No.: US 6,966,496 B2
(45) Date of Patent: Nov. 22, 2005

(54) CHIP MODULE

(75) Inventor: Harald Gundlach, Grunwald (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/776,334

(22) Filed: Feb. 10, 2004

(65) Prior Publication Data

US 2004/0178279 A1 Sep. 16, 2004

Related U.S. Application Data

(63) Continuation of application No. PCT/DE02/02758, filed on Jul. 26, 2002.

(30) Foreign Application Priority Data

Aug. 10, 2001 (DE) .............................. 101 39 383

(51) Int. Cl.⁷ .......................................... G06K 19/00
(52) U.S. Cl. .................... 235/487; 235/490; 235/492; 235/491
(58) Field of Search .............................. 235/487, 492, 235/490, 491

(56) References Cited

U.S. PATENT DOCUMENTS

| 5,541,399 A | 7/1996 | de Vall | |
|---|---|---|---|
| 6,412,701 B1 * | 7/2002 | Kohama et al. | ............ 235/488 |
| 6,581,839 B1 * | 6/2003 | Lasch et al. | ................ 235/487 |

FOREIGN PATENT DOCUMENTS

| DE | 43 19 878 A1 | 12/1993 |
|---|---|---|
| DE | 43 14 879 A1 | 11/1994 |
| EP | 0 913 268 A1 | 5/1999 |
| FR | 2 786 902 A1 | 6/2000 |

* cited by examiner

Primary Examiner—Karl D. Frech
(74) Attorney, Agent, or Firm—Darby & Darby

(57) ABSTRACT

The chip module comprises a semiconductor chip, which is fixed on a main side of a substrate of planar extent. A component, which is provided for taking up, emitting, reflecting or partially shielding electromagnetic radiation, e.g., a radiation sensor or an optical display device (display), is provided on the same main side of the substrate and is connected to the semiconductor chip. The substrate is transmissive to the relevant radiation to a sufficient extent and at least in a region occupied by the component.

9 Claims, 1 Drawing Sheet

CHIP MODULE

CROSS-REFERENCE TO RELATED APPLICATIONS

This application is a continuation of International Patent Application Serial No. PCT/DE02/02758, filed Jul. 26, 2002, which published in German on Feb. 27, 2003 as WO 03/017195 A1 and which is incorporated herein by reference in its entirety.

FIELD OF THE INVENTION

The present invention relates to a chip module which is provided for use with smart cards and has a further component in addition to a chip.

BACKGROUND OF THE INVENTION

In the future, smart cards are intended to be equipped with enhanced functions. These include not only the transmission of data by means of electrical data lines but also communication of information by electromagnetic beams which, in the simplest case, are used for optical reproduction of information. Therefore, in addition to the chip, a further component is intended to be integrated in a smart card, said further component being provided for taking up, emitting, reflecting or partially shielding electromagnetic radiation. What may be involved in this case is a display part (display) which itself emits electromagnetic waves in the optical range or, as in the case of an LCD, reflects and/or partially shields light, in order thus to effect an optical display. Moreover, said component may be a sensor or detector for radiation, which may be provided for taking up radiated information which is transmitted, e.g., by means of a suitably modulated electromagnetic wave. The component may equally emit modulated electromagnetic waves. Communication of electromagnetic radiation to the smart card or from the smart card into the observer's eye or into a detector of a terminal therefore affords a multiplicity of possibilities for enhancing the functions of a smart card. However, the problem arises, even more than in conventional chip modules, that, in addition to the semiconductor chip, a further component has to be inserted into a smart card body and be fixed there in a sufficiently fracture-resistant fashion. This process of inserting and making electrical contact with the further component must not significantly increase the manufacturing costs and the production complexity.

SUMMARY OF THE INVENTION

It is an object of the present invention to specify a chip module which can be produced in a simple manner and with which a smart card can be equipped with a chip and also a further component which is suitable for the communication by means of electromagnetic radiation.

This object is achieved by means of the chip module having the features of claim 1. Refinements emerge from the dependent claims.

The chip module comprises a semiconductor chip, which is fixed on a main side of a substrate of planar extent, said substrate being provided with electrically conductive connections on the same main side. A further component, which is provided for taking up, emitting, reflecting or partially shielding electromagnetic radiation, e.g., a radiation sensor or an optical display device (display) is provided on the same main side of the substrate. The semiconductor chip and the further component are connected to the electrically conductive connections, so that the further component is electrically connected to the semiconductor chip. What is essential to the chip module according to the invention is that the substrate is transmissive to the relevant radiation to a sufficient extent and at least in a region occupied by the further component.

What is thus achieved is that the chip module may be fitted at a top side of a card body provided with corresponding cutouts such that the main side of the substrate opposite to the components forms a top side of the smart card formed thereby. The chip and the further component are accordingly situated in the cutouts of the card body, so that the smart card can be produced with a planar top side.

The chip module therefore affords a connected arrangement of the essential constituent parts which can be produced in a simple manner. The chip and the further component connected thereto are jointly fixed to a radiation-transmissive substrate and can be inserted altogether into a card body. The substrate may be a film which is transmissive to electromagnetic radiation in the envisaged waveband, in preferred refinements a light-transmissive film, which is therefore suitable for the provision of an optical display device. A polarization film that is used any way for the top side of the LCD display may be involved in this case; it may be, in particular, a film made of polyethylene terephthalate (PET). In principle, the radiation transmissivity need only be present in the region of the component fitted. Other regions of the substrate may be covered or treated in some way such that the radiation transmissivity is reduced or no longer ensured there.

BRIEF DESCRIPTION OF THE DRAWINGS

Examples of the chip module are described in more detail below with reference to the accompanying FIGS. 1 and 2.

DETAILED DESCRIPTION OF THE PREFERRED MODE OF THE INVENTION

Figure 1:
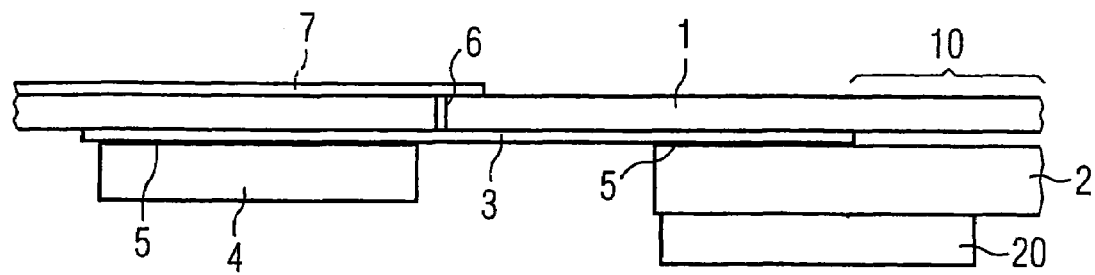
FIG. 1 shows a detail from a typical exemplary embodiment of the chip module in cross section.

FIG. 1 illustrates an arrangement in which a further component 2, electrically conductive connections 3, a semiconductor chip 4, adhesive layers 5, a plated-through-hole 6, a contact area 7, and a driver chip 20 for the further component are present on a substrate 1. In the case of the chip module according to the invention, the substrate 1, the chip 4, the further component 2 and the electrically conductive connection 3 are present independently of the possible individual embodiments, these components being provided on the same main side of the substrate 1 of planar extent.

The electrically conductive connections 3 are preferably conductor tracks made of an electrically conductive material which are applied on the relevant main side of the substrate 1 and are provided for electrical connection between the chip 4 and the further component 2. The conductor tracks may additionally be patterned in such a way that at least a portion of the conductor tracks functions as an antenna which is provided for a contactless transmission of data and/or energy. A conductor spiral or at least spiral-like conductor structure is suitable as the antenna structure. Depending on the exemplary embodiment, however, it is also possible to provide only one conductor track strip as an antenna.

In principle, it is possible to connect connecting contacts of the chip 4 and connecting contacts of the further component 2 to contact areas—provided therefor—of the electrically conductive connections 3 by means of connecting wires (bonding wires). In the preferred exemplary embodiment illustrated in FIG. 1, the components are applied on the electrically conductive connections 3 in the manner of flip-chip mounting (FCOS, flip-chip on substrate) such that the connecting contacts of the chip 4 and of the further component 2 are electrically conductively connected to the associated conductor tracks.

The adhesive layers 5 may advantageously be used for this purpose. A conductive adhesive is an adhesive provided with electrically conductive filler. Said filler is formed by electrically conductive particles, e.g., by small metal balls. If the adhesive is applied in a thin layer, the conductive particles produce electrical connections vertically with respect to the plane of the adhesive layer. The electrically conductive particles are present in the adhesive in a density or concentration such that a very dense arrangement of such vertical conductive connections is formed in the adhesive layer, while a lateral connection, i.e., a connection oriented within the layer plane, which connection would lead to a short circuit of adjacent connections, is prevented, on the other hand.

If the further component 2 is an optical display, in accordance with a preferred exemplary embodiment, said component is preferably provided with a driver 20 provided for its functionality and containing that electronic circuit which is necessary for the direct functioning of the further component 2. However, the chip 4 is provided for the driving of the further component 2, said chip containing the electronic circuits necessary for the envisaged functioning of the chip module. That is in particular a controller or processor which is set up for data transmission and data processing. The chip 4 drives the further component 2 via the electrically conductive connections 3. Thus, in a preferred exemplary embodiment in which the further component is a display device, the chip 4 can output the data content to be displayed to said component.

If the further component is a sensor, specifically a radiation detector, a driver 20 connected to the further component 2 serves to take up a measurement signal. An evaluation of a measurement signal is then likewise preferably effected in the chip 4, to which the signal is communicated via the electrically conductive connections.

The further component 2 takes up, emits, reflects or partially shields the electromagnetic radiation on its side facing the substrate 1. The function can be fulfilled by said further component 2 since the substrate 1 is transmissive to the relevant radiation to a sufficient extent at least in the region 10 depicted in FIG. 1.

If the chip 4 is intended to be able to be connected by suitable contacts to external connections, e.g., of a terminal or the like, at least one contact area 7 (e.g., made of metal) may be provided, which, owing to the envisaged use of the chip module, is preferably applied on the further main side of the substrate remote from the chip 4. For the electrical connection between the contact area and a corresponding connecting contact of the chip, a plated-through-hole 6 may be provided, which forms an electrically conductive connection through the substrate vertically with respect to the area of the substrate 1 and connects the electrically conductive contact area 7 to a connecting contact of the chip 4 which is provided therefor or to a conductor track or electrically conductive connection 3 which is provided therefor.

The arrangement of the components of the chip module enables the entire arrangement to be inserted into an otherwise homogeneous card body, in that e.g., those portions of the substrate 1 which project beyond the chip 4 and the further component 2 along the edges of the substrate are adhesively bonded onto an outer region of a top side of a card body, said outer region surrounding a cutout. The components fitted on the underside of the substrate are embedded in a filling composition or an adhesive, if appropriate, in the cutout of the card body.

In further-reaching exemplary embodiments, it is provided that the substrate 1 may comprise a plurality of layer elements or be composed of materials that are different in regions or a material which is configured differently in regions. The substrate may comprise, e.g., both a radiation-transmissive polarization layer and a substrate layer provided specifically for the carrier function of the substrate. If said substrate layer is not transmissive to the radiation, it is necessary to provide a cutout in the substrate layer in the region 10, in which the further component is arranged.

As is indicated in FIG. 1, the further component 2 may be fixed to the substrate with an edge-side region of the top side facing the substrate 1. Instead of this, the further component 2 may also be fixed to the substrate 1 over the whole area if, for this purpose, a material transmissive to the envisaged radiation is used as an adhesive. The driver 20 may also be an integral constituent part of the further component 2 or be arranged between the substrate 1 and the further component 2. In principle, the distance between the substrate 1 and the further component 2 may be arbitrarily small or else significantly larger than is reproduced in FIG. 1, in a manner not true to scale.

Figure 2:
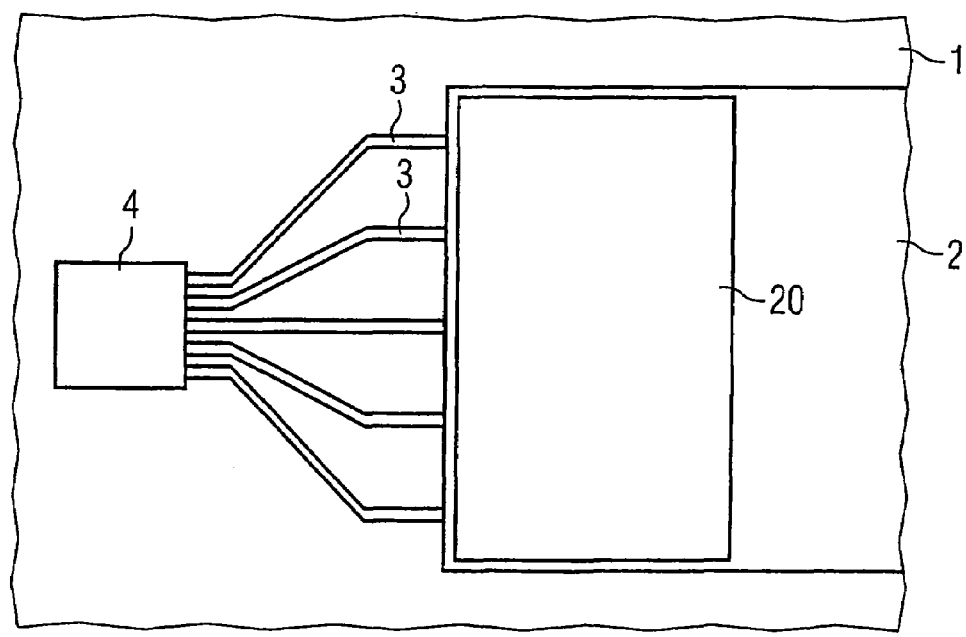
FIG. 2 shows the arrangement in accordance with FIG. 1 from the viewing direction from below.

FIG. 2 illustrates a plan view of the example of the chip module in accordance with FIG. 1 from a viewing direction from below. Thus, in this viewing direction, it is possible to discern the driver 20 on the underside of the further component 2. The electrically conductive connections 3 between the chip 4 and the further component 2 are represented here by five conductor tracks illustrated in a simplified manner. The size relationships between the chip 4, the further component 2 and the driver 20 are not defined. The chip 4 may be made larger or smaller than is illustrated in the figure. A sensor as further component 2 will possibly have considerably smaller dimensions than the chip 4. An optical display will possibly comprise a significant region of the total area of the substrate 1. No fundamental limits are imposed on these configurations within the scope of the invention. However, consideration is to be given to ensuring that the chip module has a robustness and fracture resistance necessary for easy producibility.

What is claimed is:
1. A chip module, comprising:
a semiconductor chip fixed on a main side of a planar substrate;
at least one electrically conductive connection fitted on the main side of the substrate and connected to a connecting contact of the semiconductor chip; and
a display device, which takes up, emits, reflects or partially shields electromagnetic radiation in the range of visible wavelengths, provided on the main side of the substrate and connected to the at least one electrically conductive connection,
wherein the substrate is a film which is transmissive to the radiation to permit the radiation to be taken up, emitted, reflected or partially shielded, by the display device.
2. The chip module as claimed in claim 1, wherein the substrate is polyethylene terephthalate.

3. The chip module as claimed in claim 1, further comprising at least one contact area made of electrically conductive material applied on a side of the substrate opposite the main side and connected to the at least one electrically conductive connection by a plated-through-hole passing through the substrate.

4. The chip module as claimed in claim 1, wherein the semiconductor chip and/or the display device are fixed on the substrate by means of an adhesive provided with electrically conductive filler and are connected to the at least one electrically conductive connection.

5. The chip module as claimed in claim 1, wherein the substrate has dimensions which enable fitting on a top side of a card body provided for a smart card.

6. The chip module as claimed in claim 1, wherein the electrically conductive connections comprise a conductor structure provided as an antenna.

7. The chip module as claimed in claim 1, wherein the chip drives the display device.

8. The chip module as claimed in claim 1, wherein the chip outputs data content to be displayed on the display device.

9. The chip module as claimed in claim 1, further comprising a driver, which has a circuit provided for direct functioning of the display device.

* * * * *